(12) United States Patent
Zhou et al.

(10) Patent No.: US 11,776,875 B2
(45) Date of Patent: Oct. 3, 2023

(54) SYSTEMS INCLUDING A VAPOR CHAMBER AS THE HEAT SPREADING SUBSTRATE OF A POWER DEVICE EMBEDDED IN A PCB AND METHODS OF FORMING THE SAME

(71) Applicants: Toyota Motor Engineering & Manufacturing North America, Inc., Plano, TX (US); Toyota Jidosha Kabushiki Kaisha, Toyota (JP)

(72) Inventors: Feng Zhou, Ann Arbor, MI (US); Shohei Nagai, Aichi (JP); Hiroshi Ukegawa, South Lyon, MI (US)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 70 days.

(21) Appl. No.: 17/166,241

(22) Filed: Feb. 3, 2021

(65) Prior Publication Data
US 2022/0157693 A1    May 19, 2022

Related U.S. Application Data

(60) Provisional application No. 63/113,449, filed on Nov. 13, 2020.

(51) Int. Cl.
*H01L 23/427* (2006.01)
*H05K 1/02* (2006.01)
(Continued)

(52) U.S. Cl.
CPC .......... *H01L 23/427* (2013.01); *H01L 25/072* (2013.01); *H01L 25/50* (2013.01);
(Continued)

(58) Field of Classification Search
CPC .. H05K 1/0209; H05K 1/0207; H05K 3/0061; H05K 7/06; H05K 7/1432;
(Continued)

(56) References Cited

U.S. PATENT DOCUMENTS 9,547,344 B2 * 1/2017 Han ..................... G06F 1/203
9,578,780 B1   2/2017 Shih et al.
(Continued)

FOREIGN PATENT DOCUMENTS

CN        210694658 U    6/2020
DE     102018132143 A1   6/2020
(Continued)

OTHER PUBLICATIONS

Heat dissipation for LED lighting: vapor chamber substrate printed circuit board (https://ieeexplore.ieee.org/document/5517072) Jun. 15, 2010.
(Continued)

*Primary Examiner* — Amir A Jalali
(74) *Attorney, Agent, or Firm* — Dinsmore & Shohl LLP

(57) ABSTRACT

Embedded cooling systems and methods of forming the same are disclosed. A system may include a PCB stack comprising a first major substrate opposite a second major substrate, a pre-preg layer disposed between the first and second major substrates, a power device stack embedded within the PCB stack and comprising a substrate, a power device coupled to the substrate of the power device stack, and a vapor chamber embedded within at least the pre-preg layer of the PCB stack and the power device stack being coupled to the vapor chamber.

18 Claims, 17 Drawing Sheets

(51) Int. Cl.
  *H01L 25/07* (2006.01)
  *H01L 25/00* (2006.01)
  *H05K 3/00* (2006.01)
  *H05K 1/18* (2006.01)
  *H05K 7/20* (2006.01)

(52) U.S. Cl.
  CPC ........... *H05K 1/0272* (2013.01); *H05K 1/185* (2013.01); *H05K 3/0044* (2013.01); *H05K 7/20936* (2013.01); *H05K 2201/10166* (2013.01); *H05K 2201/10174* (2013.01)

(58) Field of Classification Search
  CPC .......... H05K 7/20218; H05K 7/20254–20263; H05K 7/20272; H05K 7/2039; H05K 7/20927–20936; H05K 7/20445; H05K 7/48; H05K 7/20509; H05K 7/20945; H05K 2201/06; H01L 21/4871; H01L 23/4006; H01L 23/3672; H01L 23/473; H01L 23/49827; H01L 23/49838; H01L 23/427; H01L 25/072; H01L 2023/4087; H01H 9/52; H01H 2009/526
  See application file for complete search history.

(56) References Cited

U.S. PATENT DOCUMENTS

| | | | |
|---|---|---|---|
| 10,117,357 B2 | 10/2018 | Bai et al. | |
| 2011/0017431 A1* | 1/2011 | Yang | H01L 23/3677 29/890.032 |
| 2012/0043127 A1* | 2/2012 | Lin | H05K 1/0203 174/266 |
| 2013/0147472 A1* | 6/2013 | French | G01R 33/032 324/252 |
| 2019/0385929 A1* | 12/2019 | Ku | H01L 25/0655 |
| 2020/0098669 A1* | 3/2020 | Elsherbini | H01L 25/18 |
| 2020/0144223 A1* | 5/2020 | Tamayama | H05K 7/20809 |
| 2020/0312737 A1* | 10/2020 | Stahr | H05K 1/0272 |
| 2020/0350229 A1* | 11/2020 | Chang | H01L 23/3733 |
| 2021/0195810 A1* | 6/2021 | Joshi | H02K 11/0094 |
| 2021/0329810 A1* | 10/2021 | Goergen | G02B 6/4269 |
| 2022/0013431 A1* | 1/2022 | Zhou | H01L 23/3677 |
| 2022/0022323 A1* | 1/2022 | Zhou | H05K 7/209 |
| 2022/0039252 A1* | 2/2022 | Zhou | H02M 1/32 |
| 2022/0053630 A1* | 2/2022 | Zhou | H05K 3/0061 |
| 2022/0053634 A1* | 2/2022 | Zhou | H05K 1/0272 |
| 2022/0053666 A1* | 2/2022 | Zhou | H05K 1/0203 |

FOREIGN PATENT DOCUMENTS

| | | |
|---|---|---|
| KR | 900002214 B1 | 4/1990 |
| KR | 20150116775 A | 10/2015 |
| KR | 102100177 B1 | 4/2020 |
| WO | 2015179089 A1 | 11/2015 |

OTHER PUBLICATIONS

Playstation 5 may use vapor chamber cooling, new Sony patent suggests (https://www.tweaktown.com/news/72023/playstation-5-may-use-vapor-chamber-cooling-new-sony-patent-suggests/index.html) Apr. 23, 2020.

* cited by examiner

SYSTEMS INCLUDING A VAPOR CHAMBER AS THE HEAT SPREADING SUBSTRATE OF A POWER DEVICE EMBEDDED IN A PCB AND METHODS OF FORMING THE SAME

CROSS-REFERENCE TO RELATED APPLICATIONS

This application claims the benefit of U.S. Provisional Application No. 63/113,449, entitled "SYSTEMS INCLUDING A VAPOR CHAMBER AS THE HEAT SPREADING SUBSTRATE OF A POWER DEVICE EMBEDDED IN A PCB AND METHODS OF FORMING THE SAME," filed Nov. 13, 2020, the entirety of which is hereby incorporated by reference.

TECHNICAL FIELD

The present disclosure generally relates to heat transfer components and, more specifically, to cooling systems embedded within substrates having embedded power devices, the substrates utilizing embedded vapor chambers for the purposes of cooling the embedded power devices.

BACKGROUND

Power control units (PCUs) include power cards having power devices, cooling device(s), gate drivers, a printed circuit board (PCB), capacitors, and other components. A component of the PCU is a power card, which contains power devices that may be switched on and off in high frequency during operation of a vehicle, for example. These power devices may generate significant amounts of heat. Conventional power cards have designs for exposing surface area of the power devices for cooling purposes. Some PCU configurations include power cards that are sandwiched within liquid cooled units to maintain a proper temperature while they switch on and off, as the switching generates heat. Furthermore, the power cards are connected to the driver board through pin connections. Such power cards may be mounted to a driver board via pins and may extend a distance from the driver board, leading to a larger volume profile, which includes a small power density and a high system loop inductance, resulting in a high power loss, especially at high switching frequencies. Improvements within the PCU structure are desirable to improve the power density and cooling of the PCU.

SUMMARY

In one aspect, a system includes a PCB stack comprising a first major substrate opposite a second major substrate, a pre-preg layer disposed between the first and second major substrates, a power device stack embedded within the PCB stack and comprising a substrate, a power device coupled to the substrate of the power device stack, and a vapor chamber coupled to the power device stack, the vapor chamber being at least partially embedded within the PCB stack.

In another aspect, a method includes forming a PCB stack having a first major substrate opposite a second major substrate and a pre-preg layer disposed between the first and second major substrates, forming a recess within the PCB stack to receive a power device stack coupled to a vapor chamber, and embedding the power device stack coupled to the vapor chamber within the recess.

In yet another aspect, a system includes a printed circuit board (PCB) stack comprising a first major substrate opposite a second major substrate and a pre-preg layer disposed between the first and second major substrates, a plurality of power device stacks embedded within the PCB stack, each comprising a substrate having a cavity formed therein and an electrical insulation layer disposed on a surface of the substrate opposite the cavity, a plurality of power devices, each of the plurality of power devices received within the cavity of the substrate of each of the plurality of power device stacks and thermally coupled to the substrate, one or more vapor chambers embedded within the PCB stack and thermally bonded to the electrical insulation layer of one or more of the plurality of power device stacks, and at least one cooling assembly thermally coupled to the PCB stack.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
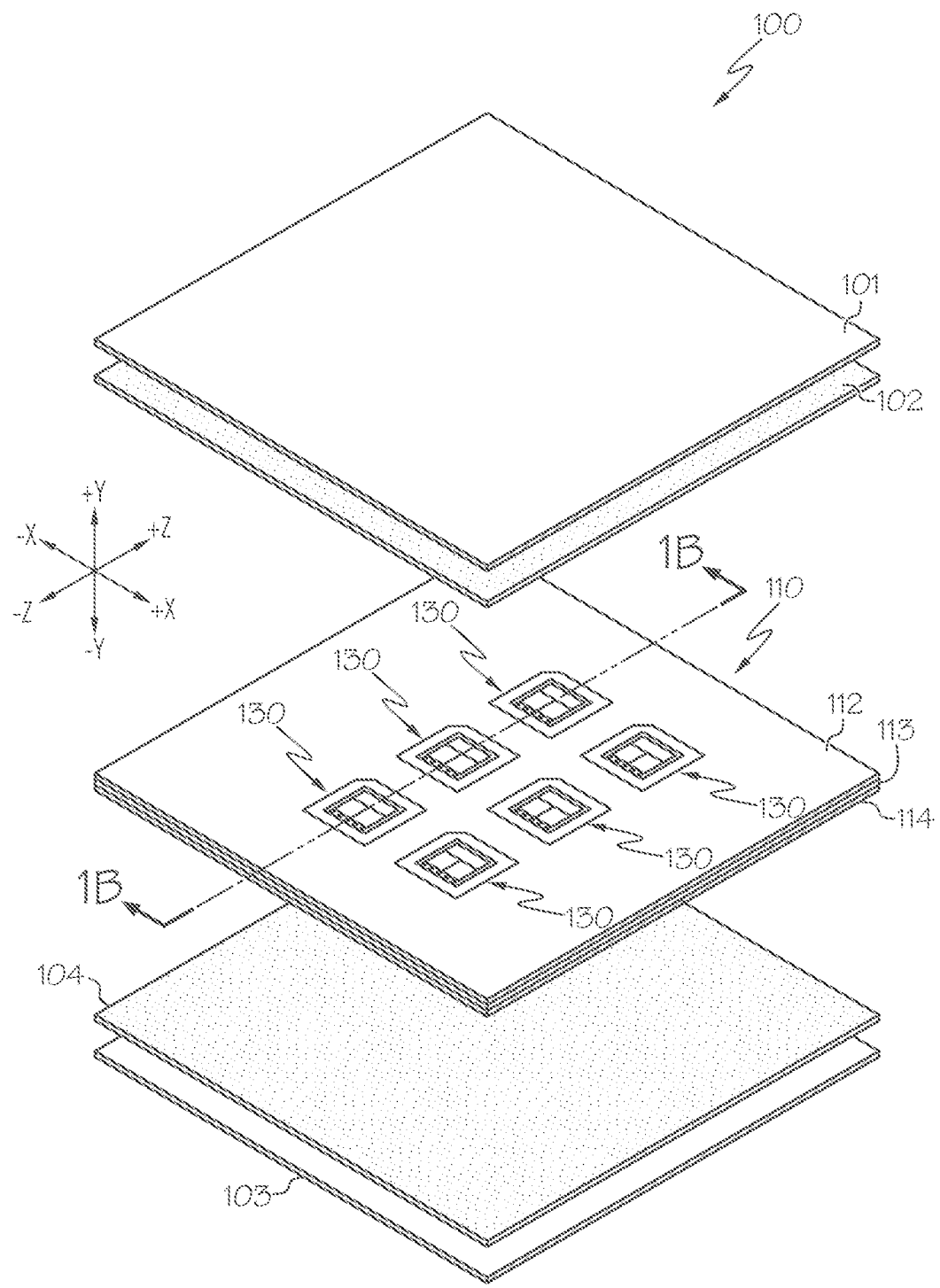
FIG. 1 schematically depicts an exploded perspective view of an illustrative embedded cooling system including a multi-layer printed circuit board (PCB) stack with a plurality of embedded power devices and a plurality of embedded vapor chambers according to one or more embodiments shown and described herein.

The devices described herein generally relate to embedded cooling systems that include power devices (e.g., embedded power semiconductor devices) and vapor chambers embedded within substrates such as gate driver printed circuit boards (PCBs). The embedded power devices shown and described herein may utilize copper layers, pre-impregnated ("pre-preg") layers, and/or copper vias to form an inverter topology, a convertor topology, or a similar topology. Various configurations are shown and described herein. One or more of the copper layers and pre-preg layers are formed to receive the embedded vapor chambers, which are configured to thermally couple an embedded power device positioned adjacent a first copper layer through one or more pre-preg layers and additional copper layers to a cooling assembly (e.g., a condenser or a cold plate) to facilitate improved heat transfer and heat spreading. Although reference may be made to the conductive substrates being made of copper, it should be understood that a variety of conductive materials may be used in place of or in combination with copper.

Each structure shown and described herein provides advantages over traditional topologies (e.g., surface mounted power device topologies) because of the location and configuration of particular components. For example, the power device embedded substrates described herein provide smaller system volumes, lighter system weights, higher system power densities (e.g., power modules that include power device embedded PCBs are configured to operate at 40 kilowatts (kW) or more), lower overall inductances that deliver smaller switching losses, particularly at high switching frequency, overall lower cost, and/or more easily fits into new and unique locations within a vehicle (e.g., within wheels or the like).

Furthermore, embodiments described herein propose various embedded power semiconductor devices within a substrate. The topologies further provide improved cooling of the system by reducing and/or eliminating thermal resistance layers between the power semiconductor devices and coolers such as vapor chambers and/or cooling assemblies. Another challenge, which is described in more detail herein, is the inability of bulk thermally conductive materials (e.g., copper layers and/or copper substrates embedded within the PCB stack) to efficiently increase the spread of heat over a surface area. That is, bulk thermally conductive materials may efficiently transport heat through a thickness of the bulk thermally conductive material (e.g., in longitudinal directions), but they do not efficiently spread heat from a source across a large area in a comparable way as vapor chambers can spread heat across large areas and transport heat through thicknesses of material. For example, a vapor chamber that receives heat generated by the power device can spread the heat over a larger effective area than a bulk thermally conductive material having dimensions similar to those of the vapor chamber. By improving heat spreading as well as heat transportation, devices can maintain lower running temperatures and the thickness of the bulk thermally conductive materials may be reduced within embedded power systems. Embodiments shown and described herein may also reduce and/or eliminate the external electrical isolation layer and/or grease layer and provide a more direct and improved thermal conductive path for removing heat from a power semiconductor device.

Traditional power device embedded PCB configurations utilize the electrical conductive properties of the copper substrates to connect to the power devices through a second surface, for example, the bottom of the copper substrates via vias. However, since the copper substrates are coupled via one or more vias, the thermal conductance from the power devices and the copper substrates is reduced since a externally attached cooling assembly and/or vapor chamber may not be bonded directly to the copper substrates but rather to the power devices through vias and one or more copper layers used to electrically couple and control the power devices. That is, due to power layers connecting to the power devices from a first surface and a second surface, opposite the first surface, of the power device, vias are needed and thus restrict thermal conduction from the copper substrates and the corresponding power devices.

Accordingly, traditional power device embedded PCB configurations connect an electrical insulation layer via one or more grease layers to a cooling assembly and optionally another electronic device such as a power capacitor that needs to be cooled. Other traditional embodiments connect an electrical insulation layer via one or more grease layers to an externally attached vapor chamber and/or a cooling assembly and optionally another electronic device such as a power capacitor that needs to be cooled.

In contrast, embodiments according to the present disclosure provide electronic assembly configurations that improve thermal conductivity of the power devices embedded in the substrates. In particular, some embodiments implement a direct bonded insulation device such as a direct bonded copper substrate, a direct bonded aluminum device, or an active metal bonding substrate to the power semiconductor device at a first surface and directly to an embedded vapor chamber at a second surface opposite the first surface, the vapor chamber being at least partially embedded within the substrate and thermally coupled to an external cooling system such as a cooling assembly or one or more additional layers of the PCB stack.

As shown and described herein, new implementations of vapor chambers embedded within a substrate are provided. Turning now to the drawings wherein like numbers refer to like structures, and particularly to FIG. 1, schematically depicts a perspective view of an illustrative embedded cooling system (110A, FIG. 11B) including a multi-layer printed circuit board (PCB) stack with a plurality of embedded power devices. In general, the PCB stack 100 includes a plurality of substrate layers 101, 112, 114, and 103 such as copper, gold, silver, aluminum or an alloy thereof interspersed by pre-preg layers 102, 113, and 104, respectively. The plurality of substrate layers 101, 112, 114 and 103 and pre-preg layers 102, 113, and 104 may be laminated together. Processes such as etching, milling, laser drilling, and the like may be implemented to create electrical connections within a substrate layer, vias between substrate layers, recesses for receiving embedded components such as vapor chambers (not shown in FIG. 1) and power devices or power device stacks 130.

As depicted in FIG. 1, the embedded cooling system is integrated within the power embedded PCB substrate 110 of the PCB stack 100. The power embedded PCB substrate 110 includes a first major substrate 112 (e.g., a top surface, facing the +Y direction of the coordinate axes of FIG. 1) opposite a second major substrate 114 (e.g., a bottom surface, facing the −Y direction of the coordinate axes of FIG. 1) and a pre-preg layer 113 disposed between the first major substrate and the second major substrate. As shown and described in more detail herein, one or more vapor chambers are positioned within at least the pre-preg layer 113. Additionally, one or more power device stacks 130 are thermally coupled to the one or more vapor chambers and further disposed within the power embedded PCB substrate 110. In some embodiments, additional substrate layers 101 and 103 and pre-preg layers 102 and 104 laminated to the power embedded PCB substrate 110. The additional substrate layers maybe one or more power conductive layers for electrically coupling to the one or more power devices of the one or more power device stacks. In some embodiments, the additional substrate layers may include one or more active or passive components electrically coupled thereto. Illustrative embodiments of the embedded cooling system will be described in more detail herein. Additionally, methods for forming the embedded cooling system will also be described in herein.

Embodiments of the present disclosure contemplate the implementation of vapor chambers for extracting heat from a power device embedded within a PCB stack 100 and increasing the spread of heat throughout layers of the PCB stack 100 and transport of heat to an externally coupled cooling system (e.g., a cold plate, heat sink, vapor chamber, or the like). In particular, embedded vapor chambers provide a more direct means of removing heat from power devices to cooling systems external to the PCB stack 100. Additional advantages to the inclusion of vapor chambers within the PCB stack 100 will be made evident herein.

Figure 2:
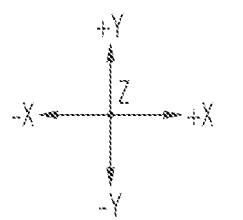
FIG. 2 depicts a cross-sectional side view of an illustrative multi-layer PCB stack according to one or more embodiments shown and described herein.
Figure 2:
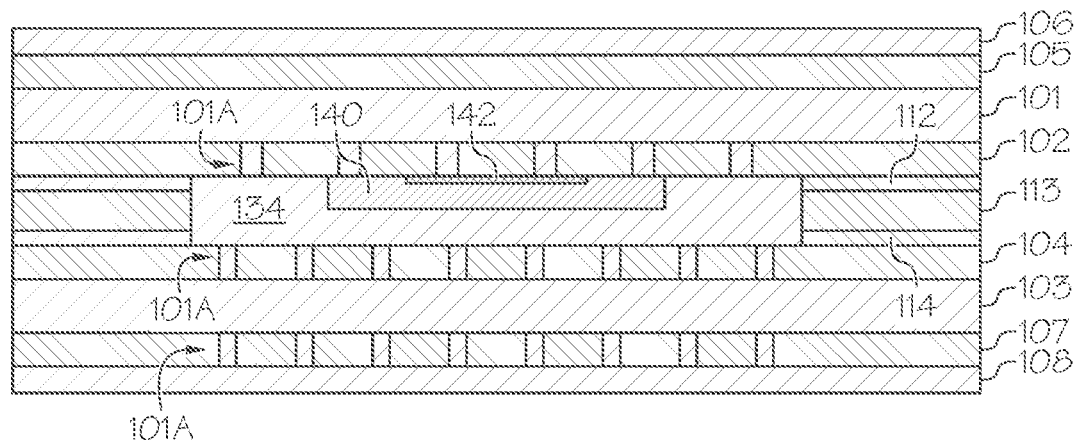

Before turning to detailed embodiments of the present disclosure, a brief discussion of a PCB stack 100 and the associated heat conduction without a vapor chamber embedded therein is provided. FIG. 2 depicts an illustrative 6-layer PCB stack 100 according to one or more embodiments shown and described herein. While a 6-layer PCB stack 100 is depicted, this is merely an example. PCB stacks 100 may include more or fewer layers. In general, PCB stacks 100 include multiple layers laminated to each other. For example, the layers may include conductive substrate layers 101, 103, 106, 108, 112, and 114 and electrical insulating layers 102, 104, 105, 107, 113 disposed between the conductive substrate layers 101, 103, 106, 108, 112, and 114. In some embodiments, insulating layers may be formed in one or multiple layers. For example, pre-preg layer 113 may be formed in two separate layers 113 such that power devices 140, substrates 134 (e.g., made of copper, aluminum, gold, silver, metal alloys and other thermally and/or electrically conductive materials) and/or other components (e.g., vapor chambers) may be embedded within the pre-preg layers. Additionally, thermal and/or conductive vias 101A, for example, copper vias may interconnect one or more conductive substrate layers 101, 103, 106, 108, 112, and 114 providing paths for electrical signals and/or thermal conductance between components and layers therein.

The conductive substrate layers may be made of copper, aluminum, gold, silver, metal alloys thereof and other electrically conductive materials. The electrical insulating layers 102, 104, 105, 107, 113 may be laminates also known as pre-preg materials. For example, such materials may include cloth or fiber material combined with a resin material, where the cloth to resin ratio determines a laminate type designation (e.g., FR-4, CEM-1, G-10, etc.) and therefore the characteristics of the laminate produced. A variety of materials having dielectric properties include polytetrafluoroethylene (Teflon), FR-4, FR-1, CEM-1 or CEM-3. Other pre-preg materials used in the PCB industry are FMeiR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

Figure 3:
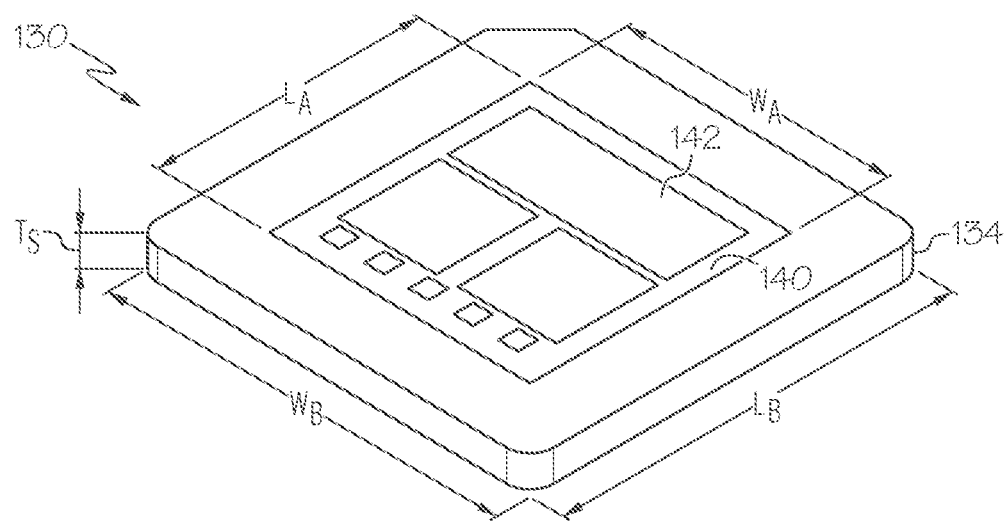
FIG. 3 depicts an illustrative power device stack having a power device bonded to a substrate according to one or more embodiments shown and described herein.
Figure 4A:
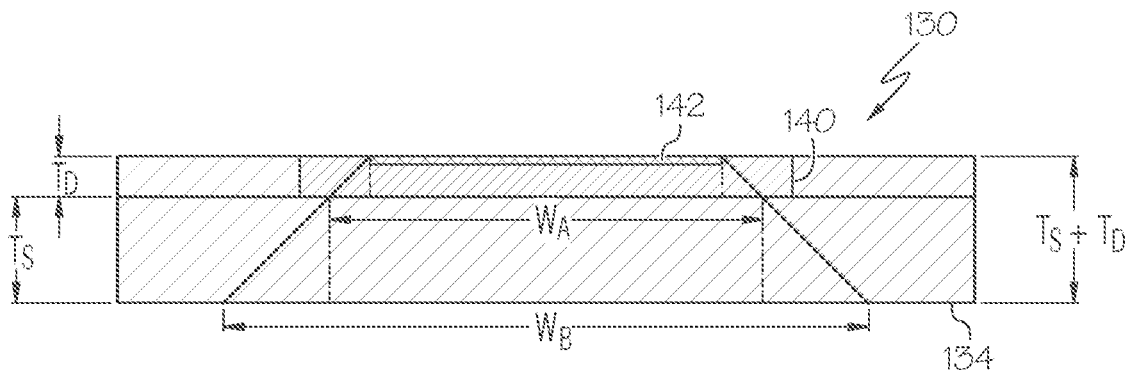
FIG. 4A depicts a cross-sectional side view of the power device stack depicted in FIG. 3.
Figure 4B:
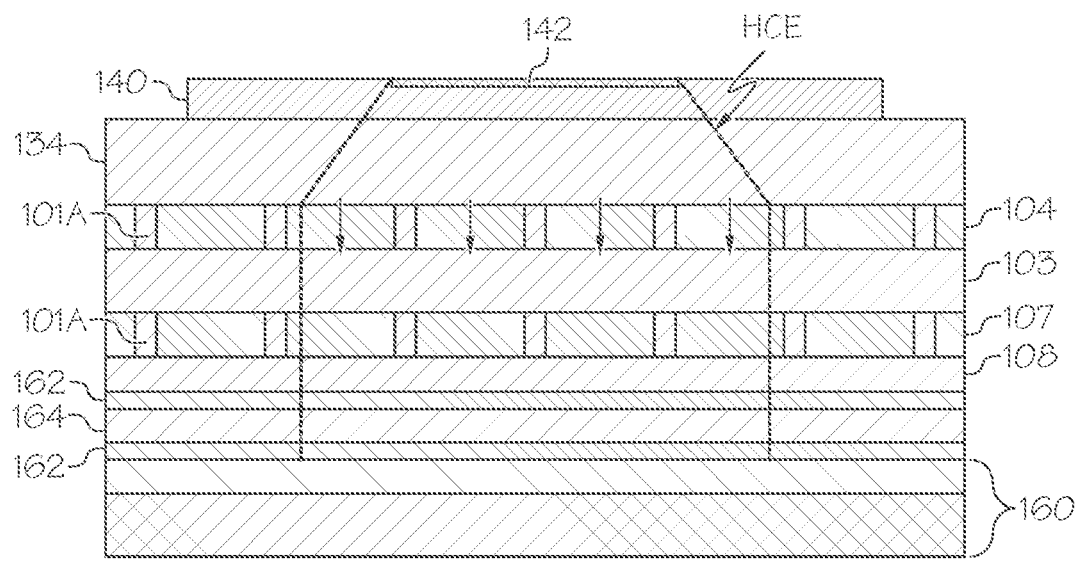
FIG. 4B depicts a cross-sectional side view of a PCB stack having the power device stack depicted in FIG. 3 and the heat flow therethrough.

FIGS. 3, 4A-4B illustrate the transfer of heat through a power device 130 (FIGS. 3 and 4A) and a PCB stack (FIG. 4B). In particular, FIG. 3 illustrates an illustrative power device stack 130 which includes a power device 140 bonded to a substrate 134. The power device 140 may be defined by a length $L_A$, a width $W_A$, and a thickness $T_D$. The power device 140 may be bonded to a substrate 134 (e.g., a copper substrate) using silver sintering 136 or other bonding techniques such as TLP bonding or the like. The substrate 134 may be defined by a length $L_B$, a width $W_B$, and a thickness $T_S$. In some embodiments, the power device 140 is bonded within a cavity in the substrate 134 configured to receive the power device 140. In other embodiments, the power device 140 is bonded to a surface of the substrate 134. For purposes of explanation in the present application, the thickness $T_S$ of the substrate 134 is the thickness of substrate material extending from a surface of the substrate 134 that is bonded to the power device 140 to the opposing surface. For embodiments, where the substrate 134 is not configured to be have a cavity which receives the power device 140, the thickness $T_S$ of the substrate 134 is the overall thickness of the substrate 134. Whereas, in embodiments where the substrate 134 includes a cavity configured to receive the power device 140, the thickness $T_S$ of the substrate 134 references the thickness of the substrate material from the base of the cavity to the opposing surface through the substrate 134. For example, as depicted in FIG. 4A, a cross-section view of the power device stack 130 from FIG. 3 is illustrated. The thickness of the power device 140 is thickness $T_D$, the thickness of the substrate 134 is thickness $T_S$ and the thickness of the power device stack 130 is thickness $T_D+T_S$.

The power devices 140 and any others depicted and described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 140 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power devices 140 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module (including the power devices 140).

Traditional embodiments of power modules including the embedded power devices 140 cannot handle the heat generated by high power semiconductor devices because the thermal conductance paths from the power semiconductor device to cooling devices have undesirable thermal resistances. These thermal resistances are the result of small isolated paths such as vias used for electrical power delivery, which are configured between one or more conductive layers that prohibit the ability for more direct bonding of a cooling assembly to a direct bonding layer and thus a low thermal resistance path. However, present embodiments utilize the vapor chambers 120 directly bonded to the power device stacks 130 coupled to the power devices 140. Such a configuration allows for more efficient and effective heat spreading and heat transfer from the power modules including the power devices 140, as described herein. The plurality of power devices 140 may be controlled by a gate drive device (not shown) in the power embedded PCB substrate 110 to change a current type between an alternating current to a direct current, for example.

For example, as shown in FIGS. 4A and 4B a heat conduction envelope HCE is depicted for an embedded power device stack 130 coupled to PCB stack. The PCB stack, as depicted, includes two conductive layers 108, 103 interspersed by electrical insulating layers 104, 107. Copper vias are positioned within and extend through the electrical insulating layers 104, 107 to electrically and/or thermally couple the substrate 134 and two conductive layers 108, 103. The second conductive layer 108 is further coupled to one or more grease layers 162, an insulation layer 164 and a cooling assembly 160. The multiple layers of the PCB stack can constitute a large thermal resistance between the power device 140 and the cooling assembly 160.

For electronics packaging, the thermal resistance is defined as: $R_{th}=L/Ak$, where $R_{th}$ is the thermal resistance is units K/W, L is the thickness of the conductor (e.g., the thickness $T_S$, A is the footprint area of the conductor, k is the thermal conductivity of the conductor material (e.g., the substrate 134). Therefore, there are three key factors that affect the thermal resistance: the area (e.g., length $L_B \times$ width $W_B$) and thickness (e.g., thickness $T_S$) of the thermal path, and the thermal conductivity of the thermal path. It is noted that the above example uses the substrate 134 to illustrate the thermal resistance definition; however, thermal resistance of the PCB stack may be determined by accounting for each layer of the PCB stack in a similar fashion as the substrate 134.

Referring to FIG. 4A, for a power device 140, the heat is generated by the active area 142 which may be at the center of the power device 140. The power device 140 is bonded to a substrate 134 before being embedded in a PCB. The power device 140 includes a portion referred to as the active area 142. The active area 142 of a power device 140 refers to the portion of the power device 140 where heat all or a significant amount of heat is generated. The heat may be a result of transistor switching, internal resistance, or the like.

The heat generated by the active area 142 is conducted through the power device substrate 140 and into the substrate 134 (e.g., copper) from the active area 142 downwards at about a 45 degree angle. That is, the substrate 134 (e.g., made of copper) may be good at conducting heat (e.g., within the heat conduction envelope HCE) from the active area 142 of the power device 140, but the effective area for heat transfer by the substrate 134 is much smaller than the actual size of the substrate 134. Effective substrate area=Active area+2(Device thickness, $T_D$)+2(substrate thickness, $T_S$).

Due to the limitation of the heat spreading of the first substrate, the HCE through the layers under the copper substrate is limited to a small area as depicted in FIG. 4B. Based on the formula of the thermal resistance, a small area leads to a big thermal resistance, so that big temperature difference between the power device 140 and the coolant in the cooling assembly 160. This becomes more critical as Si IGBTs are replaced with SiC MOSFETs type devices. SiC MOSFETs are usually smaller than Si IGBT, and thereby have a more concentrated heat source. Therefore, heat management within a PCB have embedded power devices may be improved by improving not only heat transfer through the PCB from the power device 140 to the cold plate 160, but more so by improving heat spreading from an active area 142 of a power device 140 such that the effective area for cooling is increased within the PCB stack. That is, embodiments described herein disclose the embedding of vapor chambers 120 coupled to the substrate 134 and power device 140 to improve heat spreading and heat transfer through a larger area of the PCB stack.

Referring now to FIGS. 3, 5A-5B, 6, and 7A-7B, embodiments of a power device 140 coupled to a vapor chamber 120 for embedding within a PCB stack are illustrated and described. As described herein, FIG. 3 depicts a power device stack 130. As noted above, the substrate 134 has a thickness $T_S$, when a vapor chamber 120 is incorporated in the PCB stack, the thickness $T_S$ of the substrate 134 may be reduced as the vapor chamber 120 replaces and improves upon the heat transfer characteristics previously relied upon by having a thicker substrate 134. That is, the substrate 134, now referred to as the first substrate 135, utilized for receiving the power device 140 and coupling the same to a vapor chamber 120 may have a reduced thickness $T_S$—(FIG. 5A) as opposed to the substrate 134 has a thickness $T_S$ that may be implemented in embodiments where a vapor chamber 120 is not included.

Figure 5A:
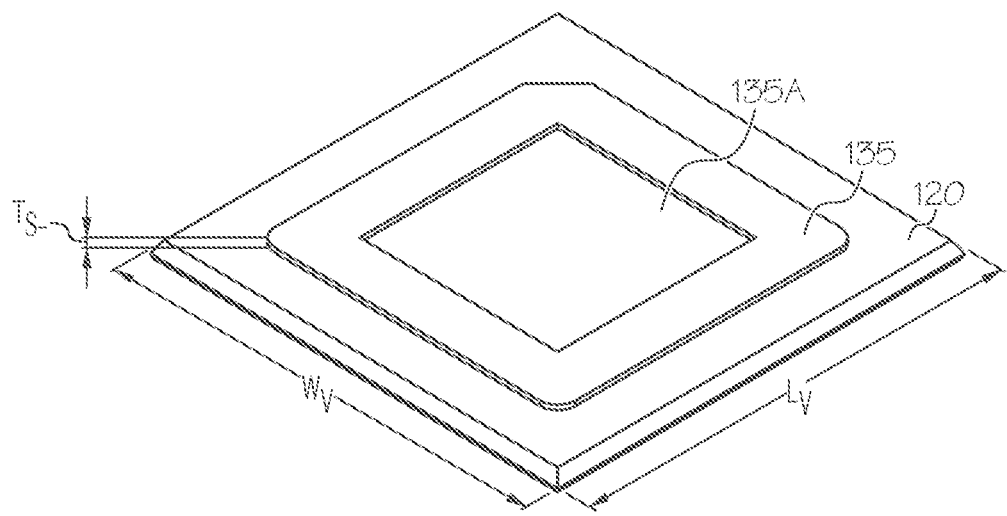
FIG. 5A an assembly of a vapor chamber coupled to a first substrate for receiving a power device for embedding within a PCB stack according to one or more embodiments shown and described herein.
Figure 5B:
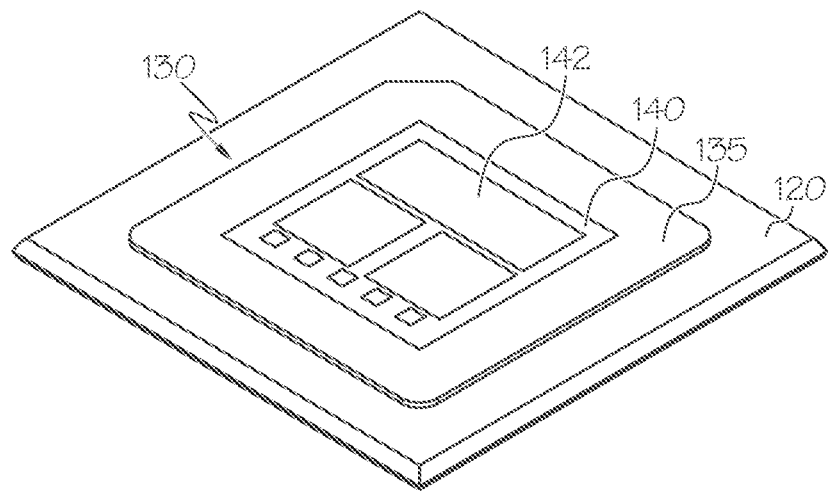
FIG. 5B an assembly of a vapor chamber coupled to a power device stack for embedding within a PCB stack according to one or more embodiments shown and described herein.
Figure 13:
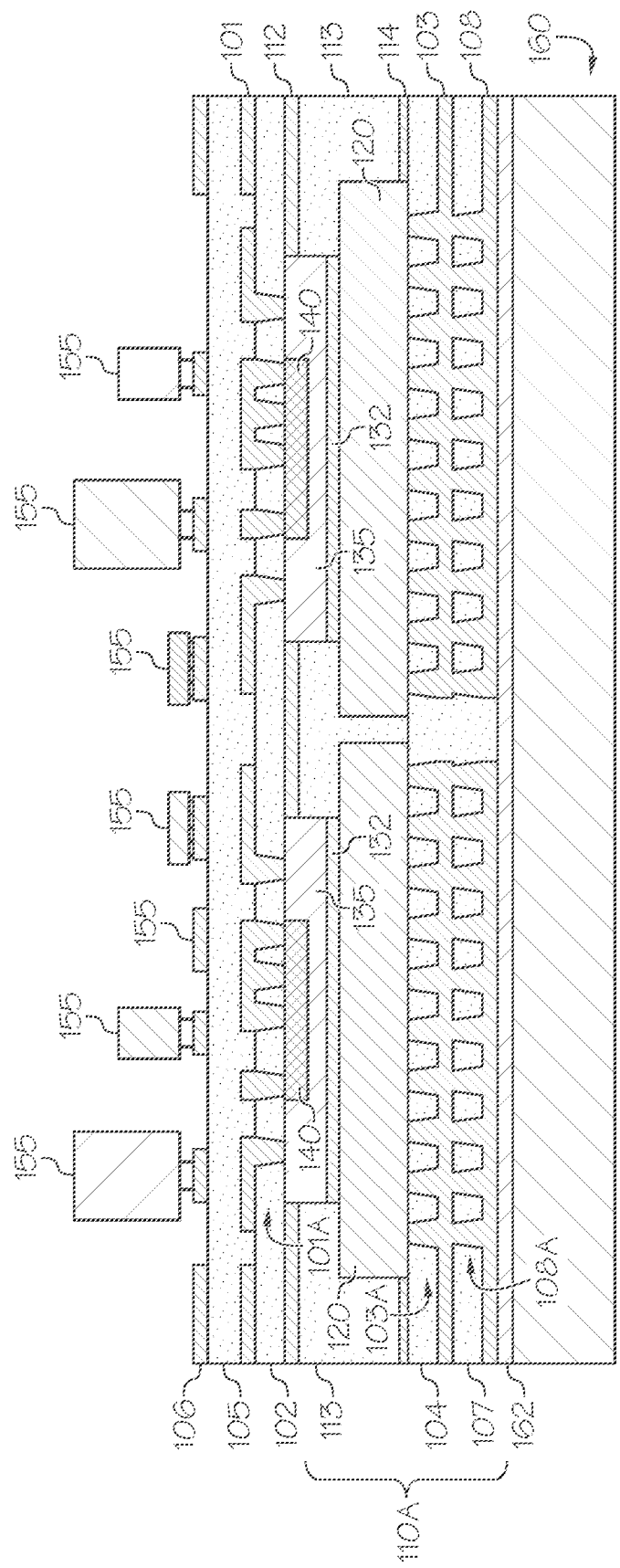
FIG. 13 depicts a cross-sectional side view of another illustrative embedded cooling system within a PCB stack and an external cooling system according to one or more embodiments shown and described herein.

Referring to FIGS. 5A and 5B, an assembly of a vapor chamber 120 coupled to a power device 140 for embedding within a PCB stack. The first substrate 135 is bonded to the vapor chamber 120 as depicted in FIGS. 5A and 5B. The power device 140 may be bonded to the first substrate 135. In some embodiments, the first substrate 135 may include a cavity 135A in a first surface of the first substrate 135 that is sized and shaped to receive one or more of the power devices 140 to provide a close mating between the power devices 140 and the first substrate 135. However, this is not a requirement as the power devices 140 may be bonded to the first substrate 135. In some embodiments, the first substrate 135 is further bonded to the vapor chamber 120 via an electrical insulation layer 132 (e.g., as depicted in FIG. 13).

The electrical insulation layer 132 could be similar to what is used in IMS substrate, where the dielectric serves as medium for the thermal conduction, but also for electrical insulation purposes as well as for bonding copper to copper. In some embodiments, a ceramic layer could be used to direct bond the first substrate 135 to the aluminum substrate of the vapor chamber 120, which is similar to direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like. That is, the power device stack 130 may be electrically isolated from the vapor chamber 120 via an electrical insulation layer 132, however, in other embodiments, the power device stack 130 may be bonded to the vapor chamber 120 without an electrical insulation layer 132.

Figure 6:
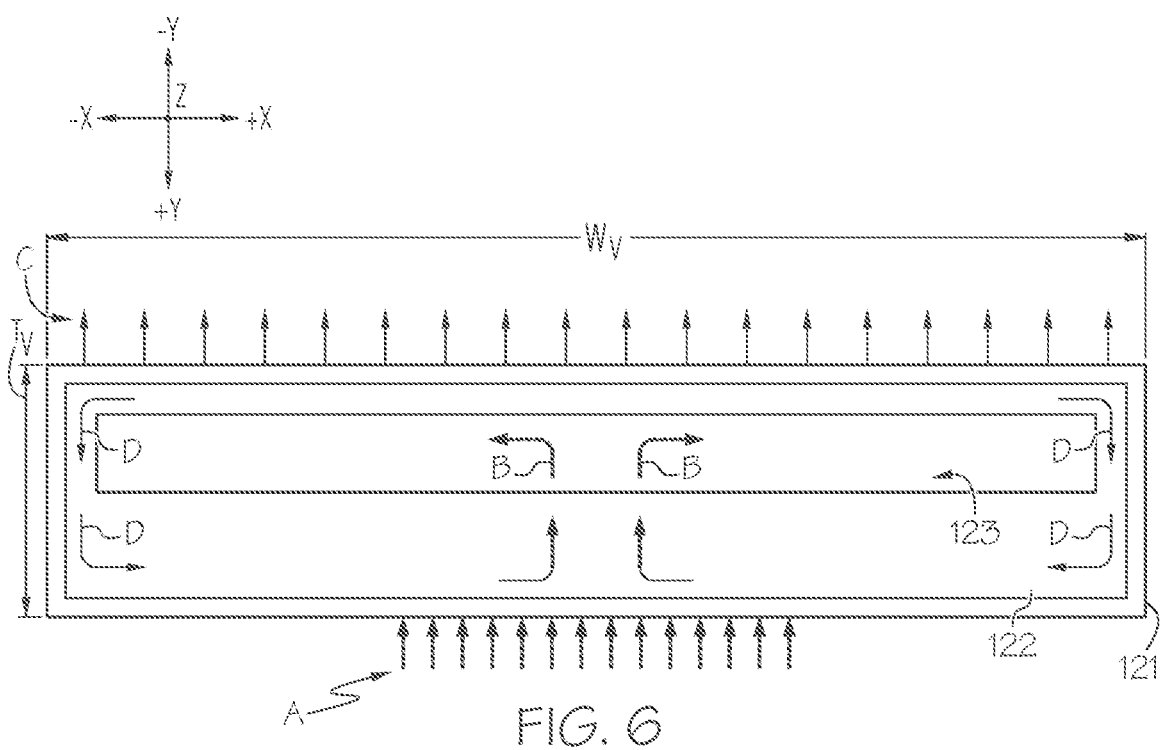
FIG. 6 depicts an illustrative cross-sectional side view of a vapor chamber for embedding within a PCB stack according to one or more embodiments shown and described herein.

The vapor chamber 120 may be defined by a length $L_V$, a width $W_V$, and a thickness $T_V$. For effective heat spreading effects, the length $L_V$ and the width $W_V$ of the vapor chamber 120 are greater than the length $L_A$ and the width $W_A$ of the power device 140 and, optionally, greater than the length $L_B$ and the width $W_B$ of the first substrate 135. Turning to FIG. 6, an illustrative cross-section of a vapor chamber 120 is depicted. Some embodiments of a vapor chamber 120 include an enclosed chamber 121 (e.g., made of copper or other thermally conductive material) which has porous media 122 sintered to the inner wall of the enclosed chamber 121 and is charged with liquid. The enclosed chamber 121 of the vapor chamber 120 may include copper, aluminum, silver, gold, or other thermally conductive material. Furthermore, the porous media 122 may be sinter metal particles such as copper, aluminum, gold, silver, or other thermally conductive material. The charged liquid is heated (depicted by heat arrows A) at the evaporator side (e.g., generally a small heating area) and becomes vapor as depicted by flow arrows B. The vapor flows (arrows B) to the condenser side. The condenser side may radiate heat as depicted by heat arrows C and also cool the liquid vapor back into a liquid phase. Since the vapor may freely flow through a void space 123 from the evaporator side to the condenser side, large heat spreading may be accomplished. The cooled liquid may flow through the porous media 122 back to the evaporator side and the cycle may repeat. By repeating this cycle, the heat is transferred from the small area on one side to a larger area on the other side of the chamber very efficiently. Accordingly, an embedded vapor chamber within a PCB may efficiently spread the heat from the small heating active area 142 of the power device 140 to a larger area to reduce the thermal resistance throughout the PCB stack.

Figure 7A:
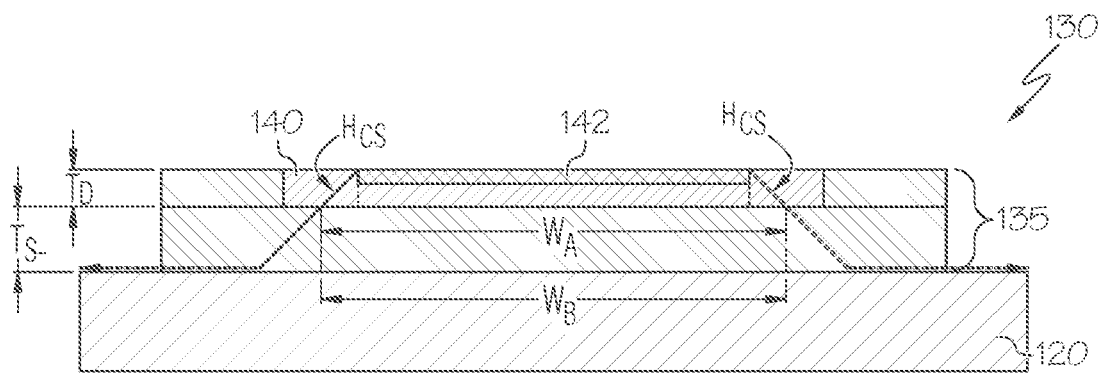
FIG. 7A depicts a cross-sectional side view of the power device stack coupled to the vapor chamber for embedding within a PCB stack
Figure 7B:
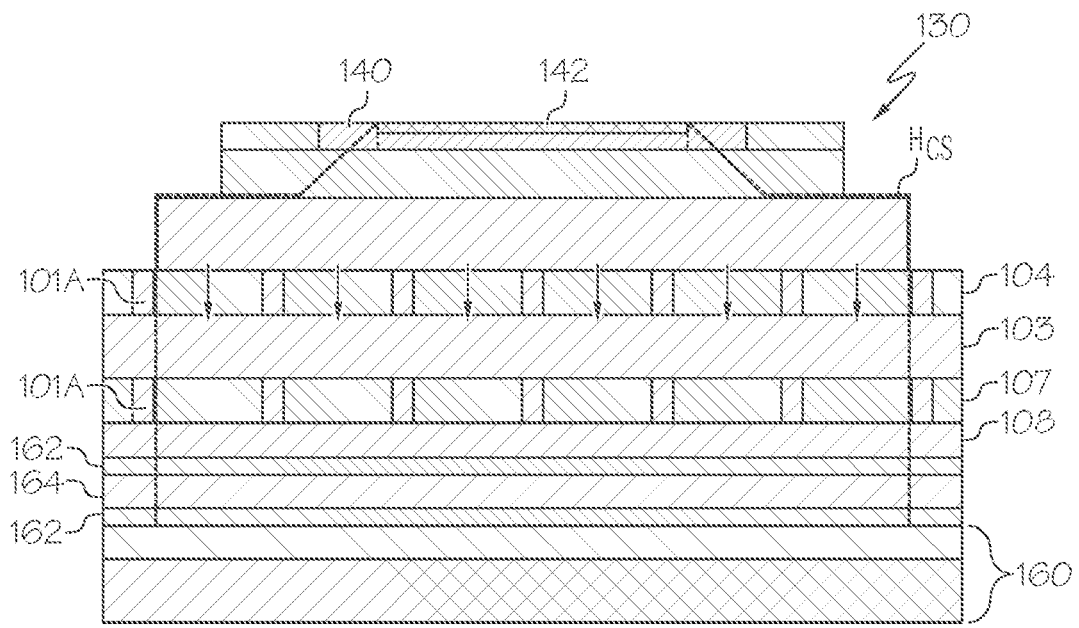
FIG. 7B depicts a cross-sectional side view of a PCB stack having the power device stack coupled to the vapor chamber and the heat flow there through as a result of the vapor chamber according to one or more embodiments shown and described herein.

For example, referring to FIG. 7A, which depicts an implementation of a power device 140 coupled to a vapor chamber 120, in comparison to FIG. 3B which only implements a substrate 134, heat conduction spreading HCS is capable. That is, the heat conduction envelope HCE depicted in FIGS. 3B and 3C is no longer restricted to a small effective area as heat is transferred through the PCB stack. When a vapor chamber 120 is embedded within the PCB stack, as depicted in FIG. 7B, heat conduction spreading HCS is possible, which creates a larger effective area for heat transfer through the PCB stack and thereby reduced the thermal resistance of the PCB stack.

Figure 8:
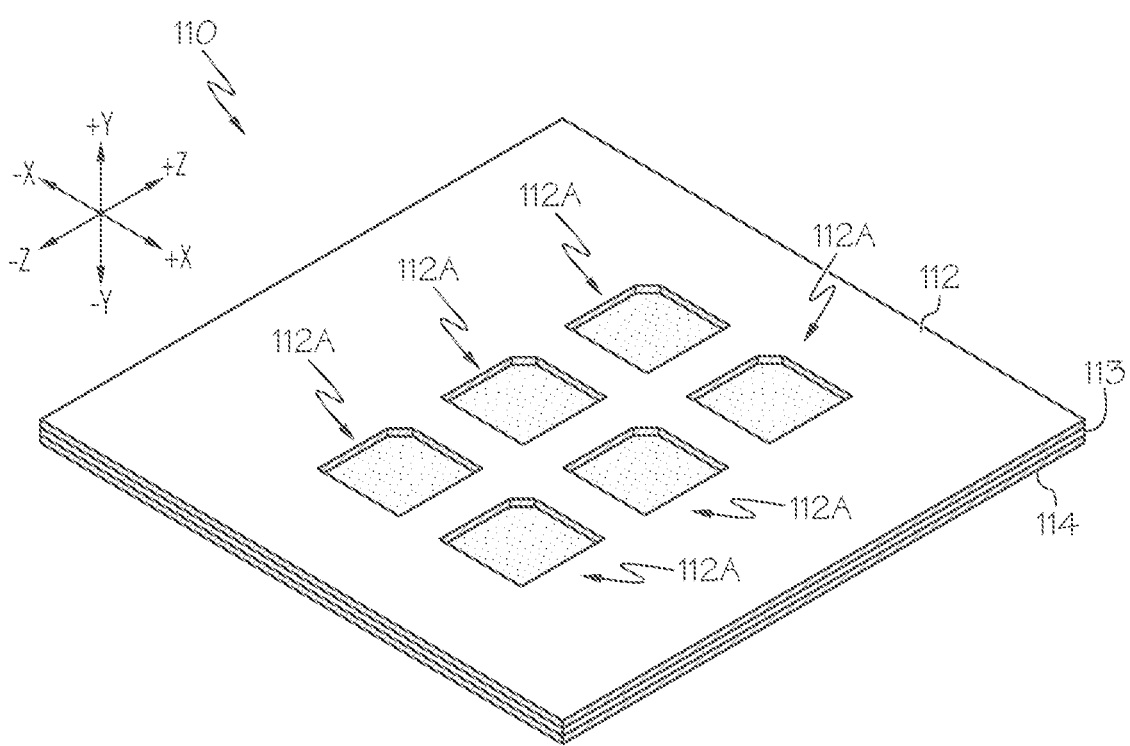
FIG. 8 depicts a perspective view of an illustrative PCB stack post-etching of a first major surface to receive one or more power device stacks according to one or more embodiments shown and described herein.

Turning now to FIGS. 8-10 and 11A-11B, an illustrative process of forming a power embedded PCB substrate 110 having one or more power devices stacks 130 and one or more vapor chambers 120. Referring to FIG. 8, a power embedded PCB substrate 110 is depicted. The power embedded PCB substrate 110 includes a first major substrate 112 opposite a second major substrate 114 and a pre-preg layer 113 disposed between the first major substrate 112 and the second major substrate 114. The first major substrate 112 and the second major substrate 114 may be a copper foil laminated to the pre-preg layer 113. In order to prepare the power embedded PCB substrate 110 to receive a power device stack 130 and a vapor chamber 120, the first major substrate 112 may be etched in a predefined pattern 112A. The predefined pattern 112A may expose the pre-preg layer 113 laminated to the first major substrate 112.

Figure 9:
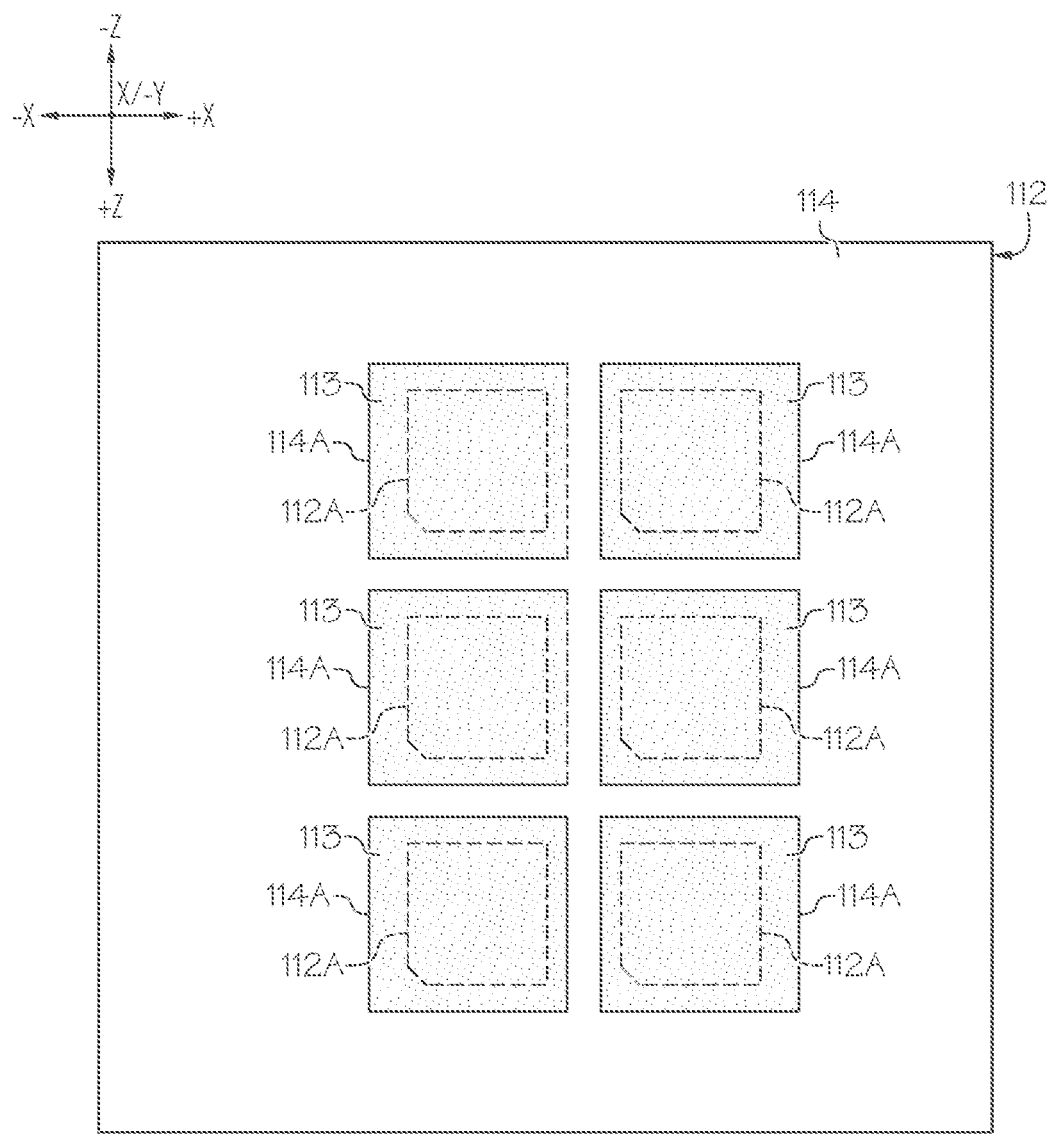
FIG. 9 depicts a bottom view of the illustrative PCB stack shown in FIG. 8 post-etching of a second major surface to receive one or more vapor chambers according to one or more embodiments shown and described herein.
Figure 10:
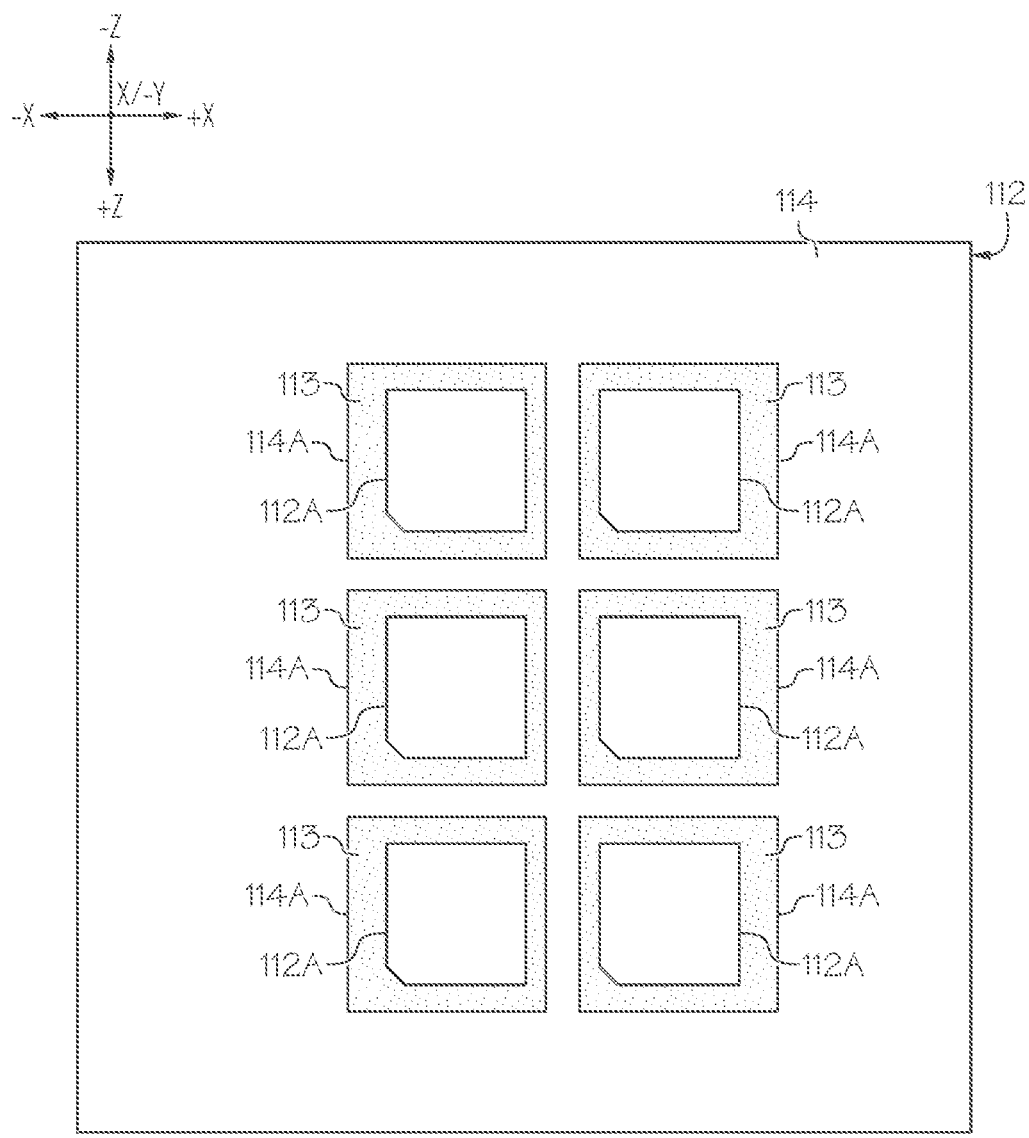
FIG. 10 depicts a bottom view of the illustrative PCB stack shown in FIGS. 8 and 9 post-machining of the pre-preg layer to receive one or more vapor chambers and one or more power device stacks according to one or more embodiments shown and described herein.

Referring now to FIG. 9, which depicts a bottom view of the illustrative power embedded PCB substrate 110 shown in FIG. 8, in a similar manner the second major substrate 114 may be etched in a predefined pattern 114A to expose the pre-preg layer 113 laminated to the second major substrate 114. The predefined pattern 114A may be a pattern corresponding to the one or more vapor chambers 120 to be embedded within the power embedded PCB substrate 110. Furthermore, as depicted in FIG. 10, the pre-preg layer 113 may then be machined to remove pre-preg material so that the one or more vapor chambers 120 and the one or more power device stacks 130 coupled thereto may be embedded within the power embedded PCB substrate 110.

As discussed above, the vapor chamber 120 could be made of copper or aluminum or a similar thermally conductive material. If the enclosed chamber 121 of the vapor chamber 120 is made of aluminum, then enclosed chamber 121 of the vapor chamber 120 may be plated with copper in order to be compatible with a PCB fabrication process using copper as the conductive substrate layers.

Figure 11A:
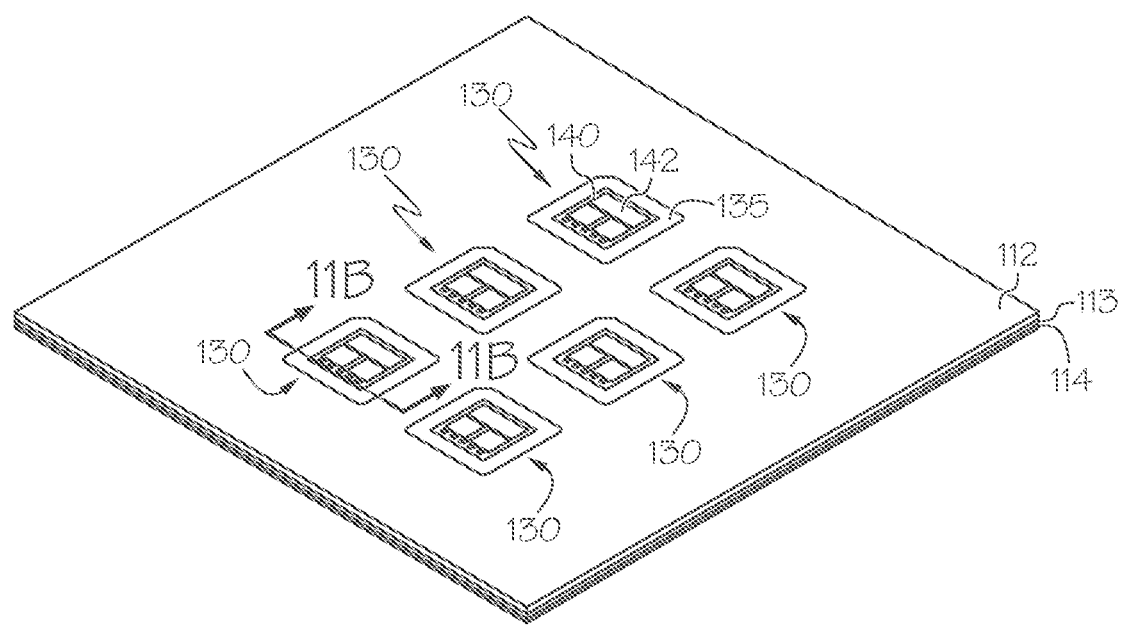
FIG. 11A depicts a perspective view of an illustrative assembled power embedded PCB substrate having a plurality of power device stacks coupled to vapor chambers shown in FIG. 5B embedded therein according to one or more embodiments shown and described herein.
Figure 11B:
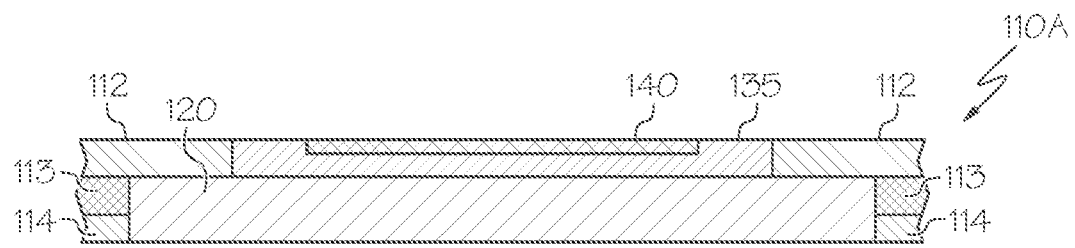
FIG. 11B depicts a cross-sectional side view of illustrative power embedded PCB substrate shown in FIG. 11A and further illustrating an embedded cooling system according to one or more embodiments shown and described herein.

Turning to FIGS. 11A and 11B, an illustrative assembly view of the illustrative power embedded PCB substrate 110 having vapor chambers 120 and power device stacks 130 embedded therein forming embedded cooling systems 110A is depicted. With the power embedded PCB substrate 110 etched and machined with recesses corresponding to the size and shape of the one or more vapor chambers 120 and the one or more power device stacks 130, the assemblies of the one or more vapor chambers 120 and the one or more power device stacks 130 may be arranged within the power embedded PCB substrate 110. As depicted in FIG. 11B, depicting a cross-sectional view of the assembled power embedded PCB substrate 110, the vapor chamber 120 may be configured to have a thickness $T_V$ that extends through all or part of the pre-preg layer 113 and the second major substrate 114 (e.g., a conductive layer).

Figure 12:
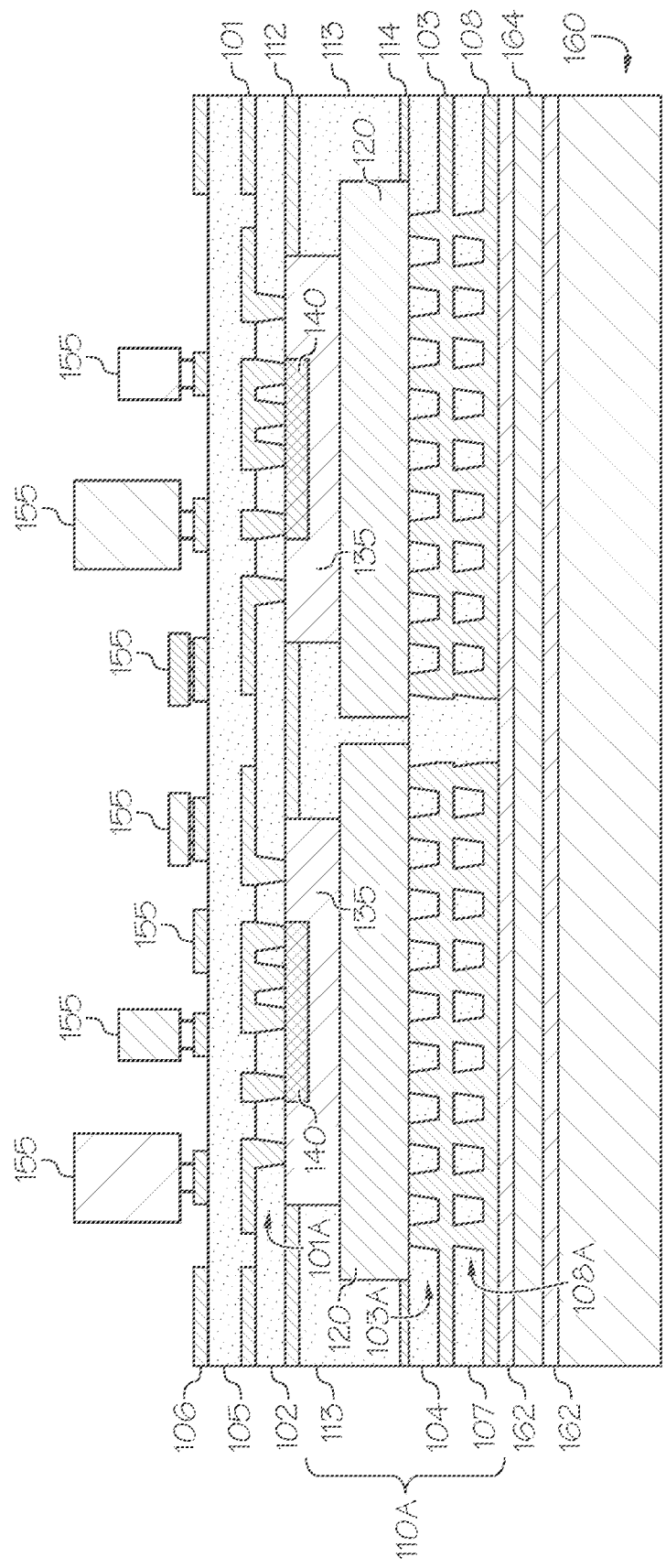
FIG. 12 depicts a cross-sectional side view of an illustrative embedded cooling system within a PCB stack and an external cooling system according to one or more embodiments shown and described herein.

FIGS. 12-16 depict various PCB stack 100 configurations having embedded vapor chambers 120 and power devices 140 according to one or more embodiments shown and described herein. Referring first to FIG. 12, a cross-section view of an illustrative PCB stack 100 having embedded vapor chambers 120 and power devices 140 is depicted according to one or more embodiments shown and described herein. For example, the power embedded PCB substrate 110 (e.g., first major substrate 112, the pre-preg layer 113, and the second major substrate 114) may include one or more conductive layers 101, 103 and electrical insulating layers 102, 104 laminated thereto. The PCB stack 100 may include further conductive substrate layers 106, 108 and electrical insulating layers 105, 107. These additional layers may provide electrical and/or thermal layers for connecting active or passive components 155 and/or external cooling assemblies 160.

The PCB stack 100 may be processed to form vias 101A between the first power layer 101 and the first major substrate 112 and power devices 140. Additionally, vias 103A and 108A may be formed to electrically and/or thermally connect the vapor chamber 120 and conductive layer 114 with conductive layer 103 and/or conductive layer 108. Laser drilling and copper plating processes may be implemented to form vias 101A, 103A, 108A. Furthermore, the PCB stack depicted in FIG. 12 includes an electrical insulation layer 164 and one or more grease layers 162 that electrically isolate, but thermally couple the PCB stack to the cooling assembly 160. The grease layers 162 may include, for example, epoxies, silicones, urethanes, acrylates, metals, metal-alloys, or any combination thereof. Cooling assemblies 160 may comprise active and/or passive cooling systems. Some cooling assemblies 160 may include heat sinks such as a fin structure or the like. Some cooling assemblies 160 may be active cooling systems such as a liquid cooled manifold. In some embodiments, the cooling assemblies 160 may include a plurality of fins past which coolant fluid may flow to draw heat from the plurality of fins. In some embodiments, cooling assemblies 160 may not include a heat sink, such as in lower power assemblies (e.g., less than about 40 KW, such as about 5 KW to about 10 KW).

In some embodiments, the one or more power layers (e.g., P, N, O layers) that are formed through lamination, laser drilling, platting, and etching processes may form a half-bridge on an inverter using the embedded power devices 140, for example. This is merely one example electrical system that may be formed within the PCB stack using processes described herein and including an embedded cooling system 110A implementing vapor chambers 120 embedded therein. In some embodiments, the embedded power devices shown and described herein may be implemented in an inverter topology, a convertor topology, or a similar topology.

Continuing with FIG. 13, another illustrative the PCB stack having embedded power devices 140 and vapor chambers 120 therein is depicted. In contrast to the PCB depicted in FIG. 12, the PCB stack is configured such that an electrical insulation layer 132 is disposed between the first substrate 135 and the vapor chamber 120. The electrical insulation layer 132, as descried above, may be electrically isolate the power device 140 from the vapor chamber 120 so that an electrical insulation layer 164 (FIG. 12) and one or more grease layers 162 may be eliminated from the PCB stack. The PCB stack of FIG. 13 further depicts that vias 103A and 108A may be implemented, similar to the configuration in FIG. 12 to provide thermal coupling between the vapor chamber 120 and the cooling assembly 160.

Figure 14:
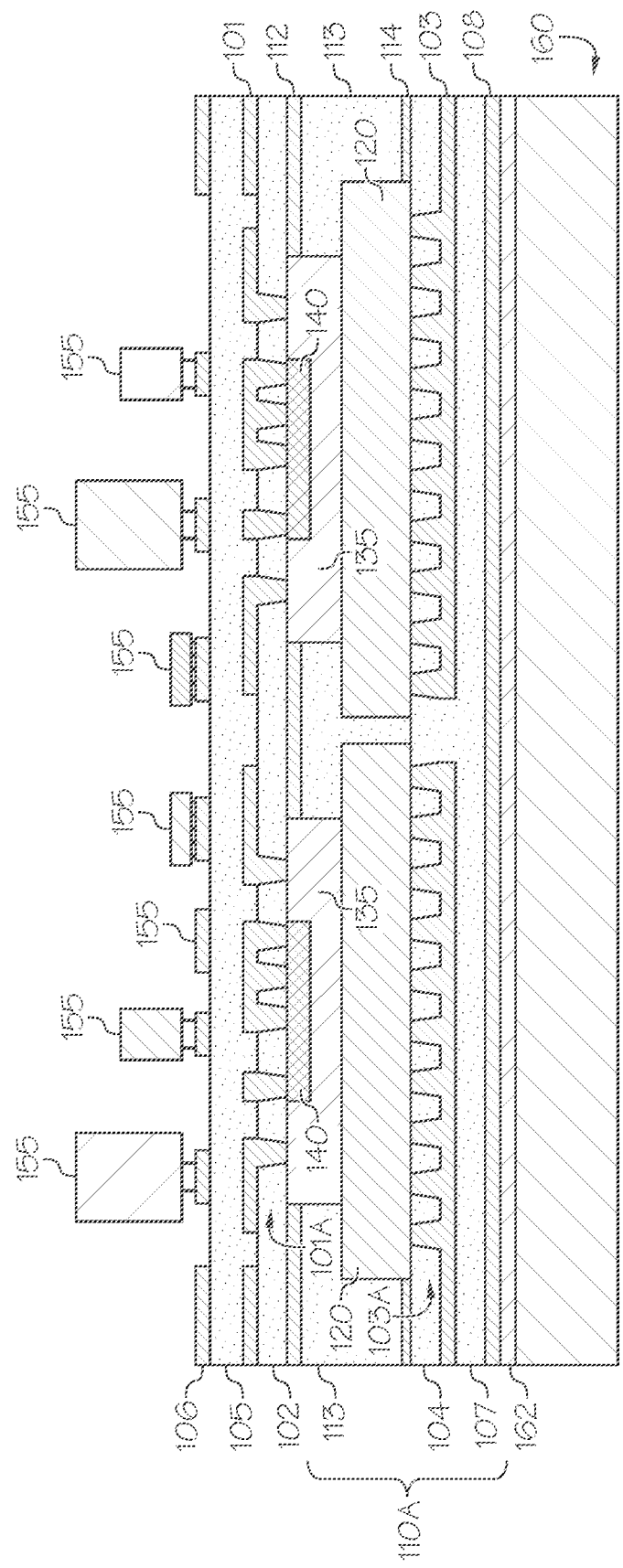
FIG. 14 depicts a cross-sectional side view of another illustrative embedded cooling system within a PCB stack and an external cooling system according to one or more embodiments shown and described herein.

In another embodiments, FIG. 14 depicts a PCB stack where instead of incorporating an electrical insulation layer 132 between the first substrate 135 and the vapor chamber 120 as shown in FIG. 13, or an electrical insulation layer 164 between conductive layer 108 of the PCB stack illustrated in FIG. 12 and the cooling assembly 160, there are no vias 108A connecting conductive layer 103 to conductive layer 108. That is, pre-preg layer 107 functions as an electrical isolation layer.

Figure 15:
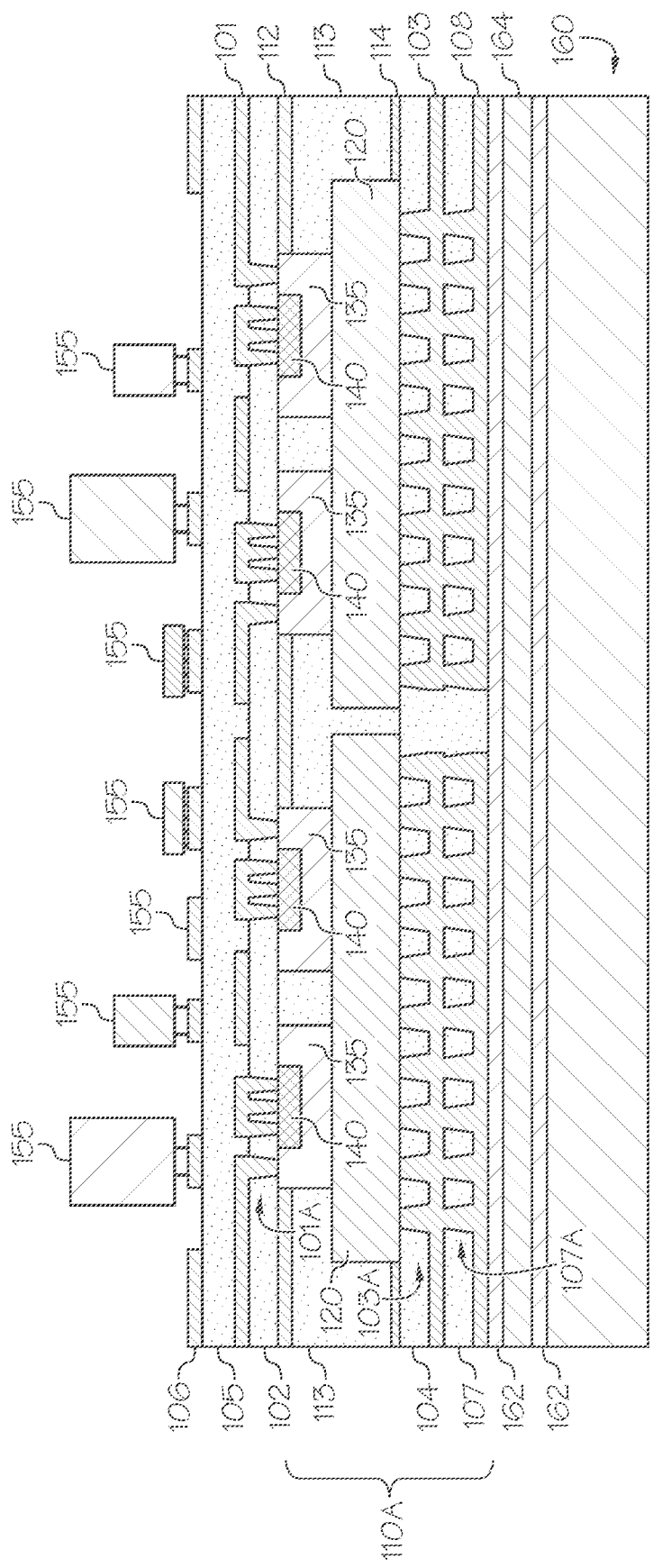
FIG. 15 depicts a cross-sectional side view of another illustrative embedded cooling system within a PCB stack where a plurality of power device stacks a coupled to independent embedded vapor chambers and an external cooling system according to one or more embodiments shown and described herein.

Turning to FIG. 15, in some embodiments, more than one power device 140 and first substrate 135 may be coupled to a single vapor chamber 120. For example, as shown in FIG. 15, two power devices 140 are thermally coupled to a single embedded vapor chamber 120. Such configurations may be implemented where a PCB stack includes more than one power device 140. The various power embedded PCB substrates and PCB stacks having embedded vapor chambers described herein should now be generally understood.

Figure 16:
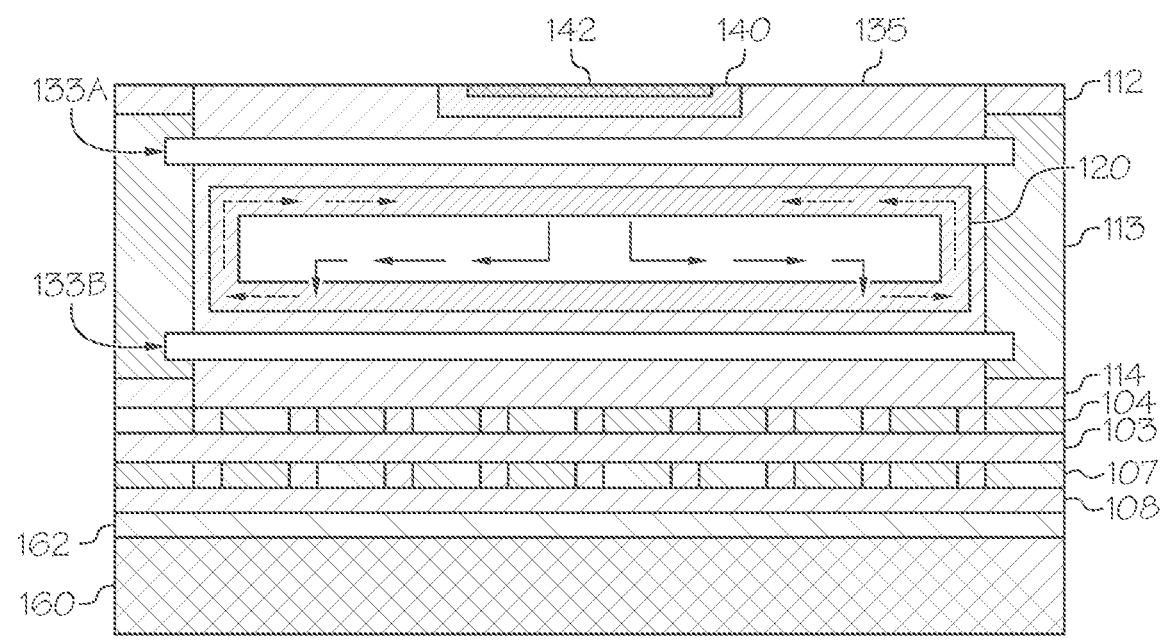
FIG. 16 depicts a cross-sectional side view of another illustrative embedded cooling system within a PCB stack where direct bond copper (DBC) thermally couples the vapor chamber to the embedded power device and the external cooling system according to one or more embodiments shown and described herein.

FIG. 16 depicts an PCB stack having an embedded vapor chamber 120 thermally coupled to the first substrate 135 and embedded power devices 140 via a first direct bond material layer 133A. In some embodiments, the embedded vapor chamber 120 may be further coupled to one or more layers of the PCB stack via a second direct bond material layer 133B. While two direct bond material layers 133A and 133B are depicted in FIG. 16, embodiments may only include one or more than two direct bond material layers 133A and 133B within the PCB stack. As discussed above, the direct bond material layers 133A and 133B may serve as an electrical isolation layer while providing efficient thermal conduction. The direct bond material layers 133A and 133B may include direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like.

Figure 17C:
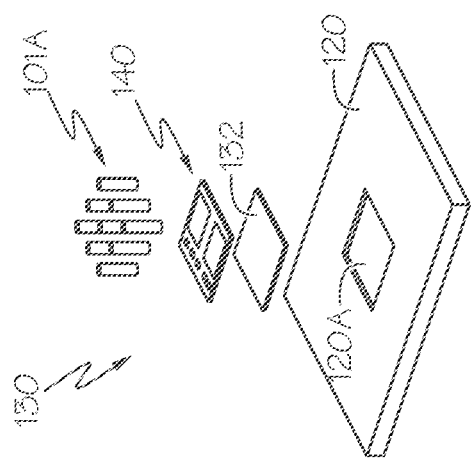
FIG. 17C depicts an assembly view a power device stack implemented in the inverter system depicted in FIG. 17A according to one or more embodiments shown and described herein.
Figure 17B:
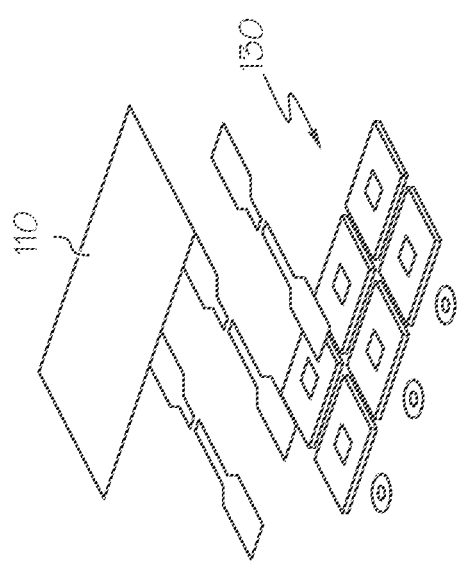
FIG. 17B depicts an assembly view of a power embedded PCB substrate implemented in the inverter system depicted in FIG. 17A according to one or more embodiments shown and described herein.
Figure 17A:
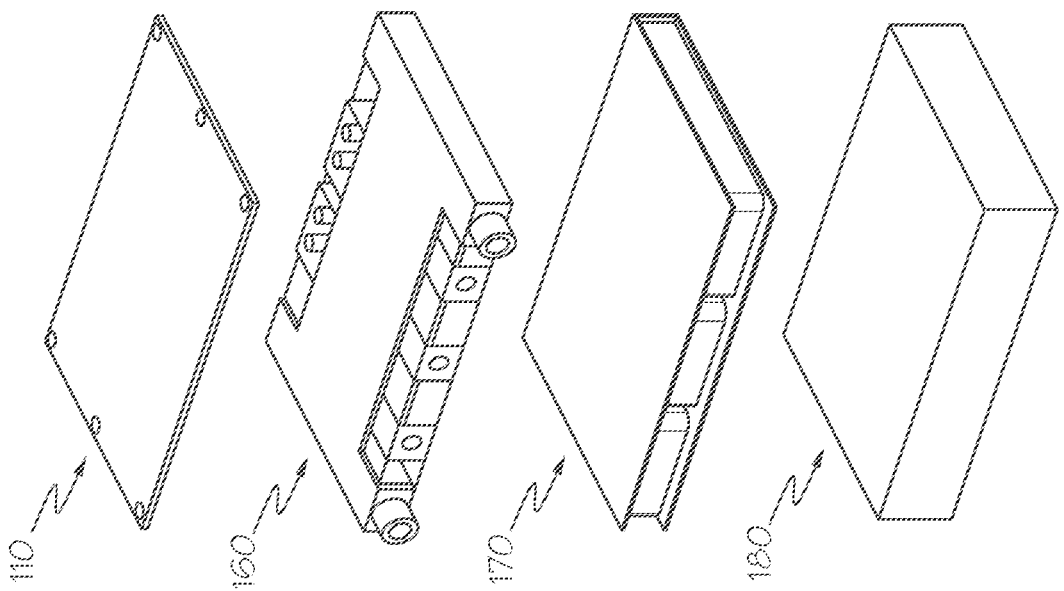
FIG. 17A depicts an assembly view of an inverter system having embedded power devices within the PCB according to one or more embodiments shown and described herein.

Referring now to FIG. 17A, an illustrative assembly of an inverter system having embedded power devices within the PCB is depicted. It should be understood that while an inverter system is depicted, other electronic systems may be implemented in a similar manner utilizing embodiments described herein. For example, in the inverter system depicted in FIG. 17, the power embedded PCB substrate 110 (or PCB stack 100 not shown) may be coupled to an external cooling assembly 160. The term "external" in the present context merely refers to the implementation of a cooling assembly that is not embedded within the power embedded PCB substrate 110 or PCB stack 100. The external cooling assembly 160 may be a liquid cooling system having a manifold for directing a liquid flow from an inlet to an outlet so that heat absorbed by the cooling assembly may be expelled from the systems coupled thereto. Additionally, the external cooling assembly 160 may be coupled to a capacitor pack 170 or other electrical system. In some embodiments, the capacitor pack 170 may be housed in a case 180 and the external cooling assembly 160 and/or the power embedded PCB substrate 110 may be mechanically coupled to the case 180 to provide a rigid package for installation in a device, machine, vehicle, or the like.

FIG. 17B depicts a more detailed assembly of the power embedded PCB substrate 110 depicted in FIG. 17A. As described herein, one or more power device stacks 130 including vapor chambers 120 coupled to power devices 140 may be embedded within a PCB stack 110. The power devices 140 may be electrically coupled to current sensor or other components for monitoring and/or controlling the operation of the power devices 140. Turning to FIG. 17C, a further illustrative detailed assembly is provided of a power device stack 130. As depicted in FIG. 17C, the vapor chamber 120 may include a cavity 120A directly formed within the vapor chamber 120 for receiving the power device 140 therein. In some embodiments, an electrical insulation layer 132 may be provided between the vapor chamber 120 and the power device 140. The electrical insulation layer 132 may be a material that enables bonding of the vapor chamber 120 to the power device 140, for example a direct bond material layer. Furthermore, one or more conductive vias 101A may be formed within the PCB stack (not shown in FIG. 17C) and coupled to the power device 140.

Figure 18:
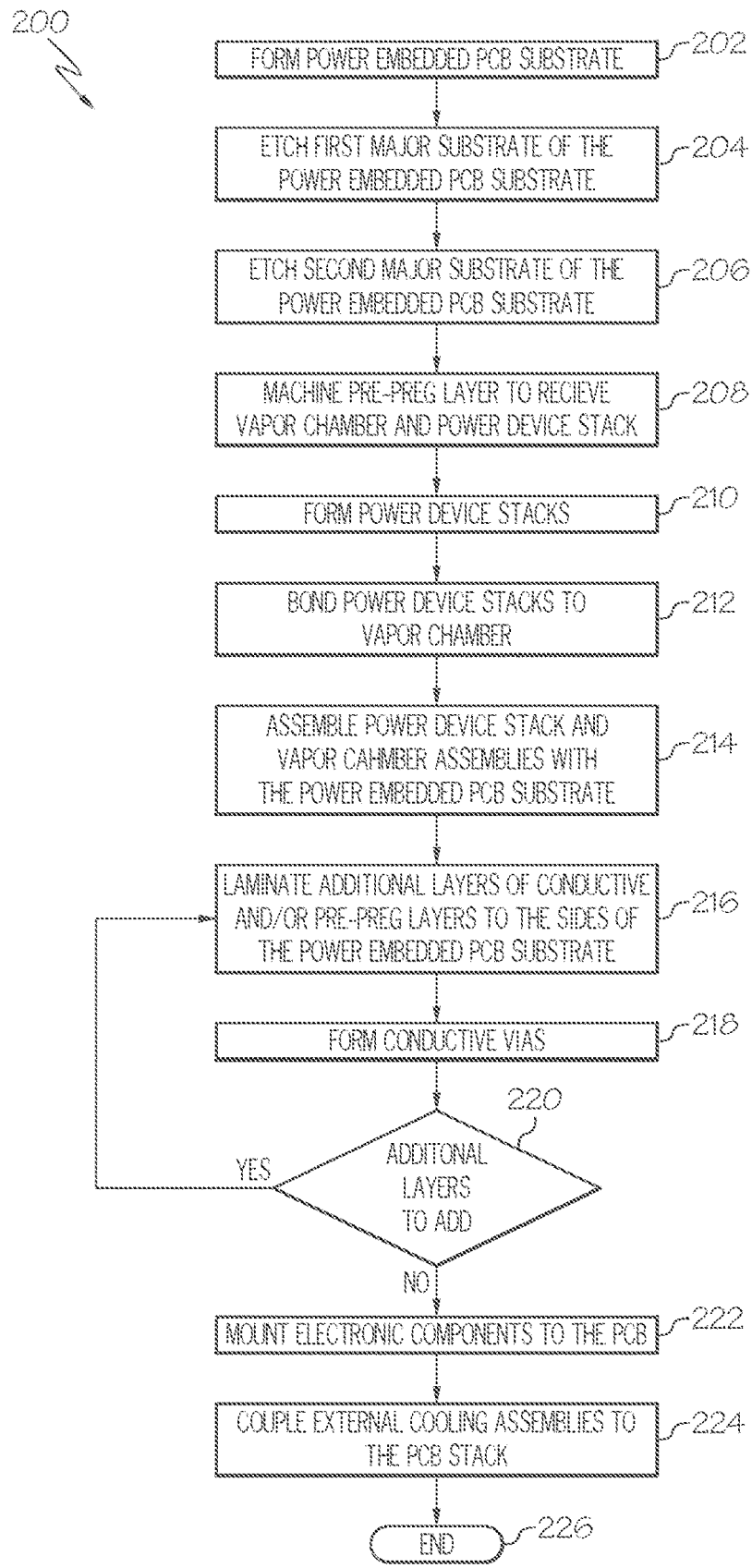
FIG. 18 depicts a flow diagram of an illustrative method of forming an embedded cooling system according to one or more embodiments shown and described herein.

Turning to FIG. 18, a method of forming an illustrative PCB stack 100 having an embedded cooling system 110A will now be described. It should be understood that the order of the process described herein with respect to FIG. 18 is merely illustrative, and that the present disclosure is not limited to the order described herein. An illustrative example of a particular ordering of steps will be described herein, but the present disclosure is not limited to such an example.

Referring to FIG. 18, the method 200 includes forming a power embedded PCB substrate 110 having one or more embedded vapor chambers 120 for extracting heat from one or more embedded power devices 140. At block 202, a power embedded PCB substrate 110 is formed. The power embedded PCB substrate 110 may be formed by laminating a first major substrate, a second major substrate and a pre-preg layer disposed between the first major substrate and the second major substrate together. The power embedded PCB substrate 110 may be processed using an etching process applied to the first major substrate 112 to etch out a predetermined pattern corresponding to the size and shape of one or more power device stacks 130 at block 204. FIG. 8 depicts an illustrative example of the power embedded PCB substrate 110 post-etching. At block 206, the power embedded PCB substrate 110 is further processed using an etching process applied to the second major substrate 114 to etch out a predetermined pattern 114A (FIGS. 9 and 10) corresponding to the size and shape of one or more vapor chambers 120. FIG. 9 depicts an illustrative example of the power embedded PCB substrate 110 post-etching on the second major substrate 114. At block 208, the pre-preg layer 113 is machined to remove pre-preg material such that the one or more power device stacks 130 and the one or more vapor chambers 120 may be received within the power embedded PCB substrate 110. FIG. 10 depicts an illustrative example of the power embedded PCB substrate 110 post-machining of the pre-preg layer 113.

At block 210, one or more power device stacks 130 are formed. A substrate 135 is coupled to a power device 140. In some embodiments, the first substrate 135 (e.g., a first copper substrate) is formed with a cavity therein, the cavity being shaped and sized to receive one or more power devices therein, as described herein. In some embodiments, the first substrate may be formed by providing a substrate and machining the cavity by removing material therefrom (e.g., machining the cavity). In other embodiments, the first substrate may be formed such that a cavity is present within the substrate (e.g., forming via an additive manufacturing process or the like). In some embodiments, the cavity may not be formed (e.g., embodiments where the power device is placed directly on a surface of the substrate not including a cavity therein).

At block 212, the one or more power device stacks 130 are thermally coupled to the one or more vapor chambers 120. The substrate 135 of the one or more power device stacks 130 may be bonded to the one or more vapor chambers 120 via an electrical insulation layer 132. The electrical insulation layer 132 could be similar to what is used in IMS substrate, where the dielectric serves as medium for the thermal conduction, but also for electrical insulation purposes as well as for bonding copper to copper. In some embodiments, a ceramic layer could be used to direct bond the first substrate 135 to the enclosed chamber 121 of the vapor chamber 120, which is similar to direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like. That is, the power device stack 130 may be electrically isolated from the vapor chamber 120 via an electrical insulation layer 132, however, in other embodiments, the power device stack 130 may be bonded to the vapor chamber 120 without an electrical insulation layer 132. FIGS. 5A and 5B depict illustrative assembled views of the one or more vapor chamber 120 and the one or more power device stacks 130.

At block 214, the vapor chambers 120 and power device stacks 130 assemblies are arranged and fastened within the recesses formed within the power embedded PCB substrate 110. Fastening techniques such as bonding or adhering with resin may be used. At block 216, one or more additional layers of conductive and/or pre-preg material layers may be laminated to the top and/or bottom of the power embedded PCB substrate 110. These layers may be further processed with etching, drilling, machining, and other processes to form interconnected layers for electrical power transfer as well as thermal conductance.

At block 218, conducive vias 101A, 103A, 108A may be formed within the layers of the PCB stack. For example, as described above, a via-hole may be drilled with a mechanical drilling process, a laser drilling process, or the like. Once the via-hole is formed, a conductive material may be flowed into the via-hole to form an electrical or thermal pathway through a pre-preg layer.

At block 220, a decision is made as to whether the embedded cooling system 110A includes additional layers of pre-preg material and/or conductive material are to be added to the PCB stack. Additionally, a determination may also be made as to whether to attach other PCB stacks, power devices, and vapor chambers (e.g., embodiments containing a plurality of stacks, power devices, and/or vapor chambers, as described herein). If additional components are to be added to the embedded cooling system 110A, the process may repeat at block 216. If no further components are to be added, the process may proceed to block 222.

At block 222, electrical components 155 are mounted to the PCB. The electrical components 155 may be mounted through a pick-and-place operation, soldering, or other mechanical and electrical fastening means. At block 224, external cooling assemblies and/or other electrical systems such as a capacitor pack or the like may be coupled to the PCB stack as depicted in FIG. 17A, for example. It is understood that the process depicted in FIG. 18 and described herein is one embodiment. Some steps may be omitted and/or performed in a different order while achieving the same result.

It should now be understood that the embedded cooling systems described herein include power devices (e.g., embedded power semiconductor devices) and vapor chambers embedded within substrates such as gate driver printed circuit boards (PCBs). The embedded power devices shown and described herein utilize copper layers and/or insulation layers to form an inverter topology, a convertor topology, or a similar topology. One or more of the copper layers are formed to receive the embedded vapor chambers.

Moreover, the present disclosure describes designs for embedding a miniature vapor chamber in PCB board bonded under the power device to effectively spread the heat from a small device footprint to a larger footprint, so that the thermal resistance of the PCB layer and grease layer under the vapor chamber is reduced. These designs decrease the thermal resistance from the power device to the cooling assembly significantly so that the power device can be cooled more effectively.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system comprising:
a PCB stack comprising a first major substrate opposite a second major substrate;
a pre-preg layer disposed between the first and second major substrates;
a power device stack embedded within the PCB stack and comprising a substrate; a power device coupled to the substrate of the power device stack, wherein the substrate of the power device stack comprises a cavity for receiving the power device; and
a vapor chamber coupled to the power device stack, the vapor chamber being at least partially embedded within the PCB stack.

2. The system of claim 1, further comprising a cooling assembly thermally coupled to the PCB stack.

3. The system of claim 2, further comprises:
an insulation layer disposed between the cooling assembly and the PCB stack.

4. The system of claim 1, wherein the vapor chamber comprises:
an enclosed chamber having a porous media disposed on inner walls of the enclosed chamber, and
a liquid disposed within the porous media, wherein heat generated by the power device vaporizes the liquid within the enclosed chamber on an evaporator side and the vaporized liquid condenses back to liquid phase on a condenser side of the enclosed chamber.

5. The system of claim 1, wherein one or more recesses are formed in the second major substrate and the pre-preg layer, the one or more recesses shaped and sized to receive the vapor chamber and the power device stack therein.

6. The system of claim 1, wherein the substrate is formed from copper, aluminum, gold, silver, or an alloy thereof.

7. The system of claim 1, wherein the power device stack further comprises an electrical insulation layer positioned between the substrate and the vapor chamber.

8. The system of claim 7, wherein the electrical insulation layer is a ceramic dielectric layer or an insulated metal substrate (IMS) dielectric layer.

9. The system of claim 1, wherein the PCB stack comprises one or more power conductive layers electrically coupled to the power device via one or more vias.

10. The system of claim 1, wherein the PCB stack comprises one or more power conductive layers and one or more active or passive components electrically coupled to the one or more power conductive layers.

11. The system of claim 1, wherein the vapor chamber receives heat generated by the power device and spreads the heat over a larger effective area than a bulk substrate of having dimensions similar to the vapor chamber.

12. The system of claim 1, wherein the power device stack comprises a plurality of power device stacks arranged in an array, wherein at least two of the plurality of power device stacks are coupled to the vapor chamber.

13. The system of claim 1, wherein a power module comprising the PCB stack and the power device has a power rating greater than or equal to 40 kilowatts (kW).

14. A method comprising:
forming a PCB stack having a first major substrate opposite a second major substrate and a pre-preg layer disposed between the first and second major substrates;
forming a recess within the PCB stack to receive a power device stack coupled to a vapor chamber;
machining a cavity within a substrate to receive a power device; bonding the power device to the substrate to form the power device stack; bonding the power device stack to the vapor chamber; and
embedding the power device stack coupled to the vapor chamber within the recess.

15. The method of claim 14, wherein forming the recess within the PCB stack comprises:
etching the first major substrate and the second major substrate; and
machining the pre-preg layer, wherein the etched first major substrate, the etched second major substrate, and the machined pre-preg layer form the recess to receive the power device stack coupled to the vapor chamber.

16. The method of claim 14, wherein the power device stack is bonded to the vapor chamber via an electrical insulation layer disposed between the power device stack and the vapor chamber.

17. A system comprising:
a printed circuit board (PCB) stack comprising a first major substrate opposite a second major substrate and a pre-preg layer disposed between the first and second major substrates;
a plurality of power device stacks embedded within the PCB stack, each comprising a substrate having a cavity formed therein and an electrical insulation layer disposed on a surface of the substrate opposite the cavity;
a plurality of power devices, each of the plurality of power devices received within the cavity of the substrate of each of the plurality of power device stacks and thermally coupled to the substrate;
one or more vapor chambers embedded within the PCB stack and thermally bonded to the electrical insulation layer of one or more of the plurality of power device stacks; and at least one cooling assembly thermally coupled to the PCB stack.

18. The system of claim 17, wherein the PCB stack comprises one or more power conductive layers electrically coupled to the plurality of power devices via one or more vias.

\* \* \* \* \*